United States Patent [19]

Spencer

[11] Patent Number: 5,496,970
[45] Date of Patent: Mar. 5, 1996

[54] PLANAR CABLE ARRAY

[75] Inventor: Mark S. Spencer, Phoenix, Ariz.

[73] Assignee: W. L. Gore & Associates, Inc., Newark, Del.

[21] Appl. No.: 309,375

[22] Filed: Sep. 20, 1994

Related U.S. Application Data

[63] Continuation-in-part of Ser. No. 111,673, Aug. 25, 1993, Pat. No. 5,449,862, which is a continuation-in-part of Ser. No. 65,344, May 20, 1993, Pat. No. 5,383,788.

[51] Int. Cl.$^6$ .............................. H01B 7/00; H05K 1/00; H01R 9/07; H01R 13/64
[52] U.S. Cl. .................. 174/117 F; 174/117 FF; 174/268; 439/493; 439/246; 439/67; 439/77
[58] Field of Search .................. 174/117 F, 117 FF, 174/117 R, 268; 439/67, 77, 492, 493, 246

[56] References Cited

U.S. PATENT DOCUMENTS

| | | | |
|---|---|---|---|
| 3,158,421 | 11/1964 | Hasenauer . | |
| 3,533,049 | 10/1969 | Thompson . | |
| 3,547,718 | 12/1970 | Gordon | 174/117 F |
| 3,551,585 | 12/1970 | Smart | 174/72 |
| 3,703,604 | 11/1972 | Henschen | 174/75 R |
| 3,704,164 | 11/1972 | Travis | 174/117 F |
| 4,467,138 | 8/1984 | Brorein | 174/117 F |
| 4,639,693 | 1/1987 | Suzuki | 174/117 F |
| 4,716,259 | 12/1987 | Tokura et al. | 174/68.5 |
| 4,906,803 | 3/1990 | Albrechta | 174/254 |
| 5,015,197 | 5/1991 | Redmond | 439/329 |
| 5,383,788 | 1/1995 | Spencer | 439/67 |
| 5,435,732 | 7/1995 | Angulas | 439/67 |
| 5,449,862 | 9/1995 | Spencer | 174/117 F |

FOREIGN PATENT DOCUMENTS

| | | |
|---|---|---|
| 2557385 | 6/1985 | France . |
| 2646566 | 11/1990 | France . |
| 7809466 | 7/1978 | Germany . |
| 2-46605 | 2/1990 | Japan . |
| 4-33211 | 2/1992 | Japan . |
| 372580 | 5/1973 | U.S.S.R. . |
| 1415236 | 8/1988 | U.S.S.R. . |
| 1472688 | 5/1977 | United Kingdom . |

OTHER PUBLICATIONS

IBM Tech. Disclosure Bu-letin, vol. 24, No. 9—Feb. 1982.

Primary Examiner—Leo P. Picard
Assistant Examiner—Stephen T. Ryan
Attorney, Agent, or Firm—Gary A. Samuels

[57] ABSTRACT

This invention provides a high-density planar contact array capable of interconnecting various electronic devices using a pad to pad approach or pad to pin, which is capable of accommodating non-coplanarity in the Z axis of printed circuit boards but which still maintains good electrical contact.

The array comprises an insulative substrate sheet that has a plurality of parallel conductive lines terminating in a pad over a hole in the substrate.

2 Claims, 1 Drawing Sheet

PLANAR CABLE ARRAY

CROSS-REFERENCE TO RELATED APPLICATION

This application is a continuation-in-part of application Ser. No. 08/111,673 filed Aug. 25, 1993, now U.S. Pat. No. 5,449,862 which was a continuation-in-part of application Ser. No. 08/065,344 filed May 20, 1993 now U.S. Pat. No. 5,383,788.

FIELD OF THE INVENTION

This invention relates to a high-density planar electrical contact array, which is used for electrical signal transmission between a planar circuit, such as a printed circuit board, and other electrical devices such as a second printed circuit board.

BACKGROUND OF THE INVENTION

It is often necessary to provide a means for transmitting electrical signals from one planar circuit, such as a printed circuit board to another circuit board or integrated circuit lead frame, multi-chip module, tape automated bonding devices or other device that utilizes electrical contacts. Various connector and contact devices have been used in the past to accomplish this. One existing method utilizes individual formed metal contacts imbedded in an insulative housing that separates each contact from adjacent contacts with each contact being directly connected to the other device or through a wire or flexible circuit board to another device. Another method utilizes individual wires inserted into a comb-like insulative housing which separates each wire from adjacent wires thus forming individual contacts out of the wire itself. Yet another method utilizes a single or multiplicity of parallel lines on a printed circuit, usually a flexible printed circuit, and uses these lines as contacts by mating them directly to a device and applying pressure via an elastomeric material and/or clamping device. However, this last method does not allow good Z axis movement of an individual contact without affecting adjacent contacts unless the insulative planar substrate material is extremely thin, between 0.001 inch and 0.003 inch thick, or each conductor must have insulative layer removed from between each conductor. The first method involves a very thin substrate and limits the use of multiple layered and controlled impedance constructions and must usually require some other means of mechanical support such as an elastomeric material behind the conductors and substrate. The second method, i.e., removing the insulative substrate material allows lateral or X or Y axis movement which can result in misalignment to the device being mated to or the shorting of adjacent conductor pads.

It is a common deficiency in many printed circuit boards that the substrate board is not completely planar, i.e., it contains "valleys" and "hills" over its surface. Thus, when a ribbon cable interconnect is employed, the variation in surface planarity of the board causes uneven contact between the traces of the board and the conductors of the cable array. This invention overcomes that deficiency.

SUMMARY OF THE INVENTION

This invention provides a high-density planar cable array capable of interconnecting various electronic devices using a pad to pad approach or pad to pin, and which is capable of accommodating non-coplanarity in the Z axis of printed circuit boards but which still maintains good electrical contact.

The invention is a planar cable array for transmitting electrical signals comprising:

an elongated planar strip of electrical insulating material 10, said strip having a plurality of holes 42 extending through the strip at a section thereof;

a plurality of parallel electrical conductors 40 affixed to and extending lengthwise along said strip;

one end of each conductor having a conductive pad attached thereto, said pad of each conductor being disposed and positioned within a corresponding aforesaid hole, whereby each said pad freeing floats within said hole in the Z axis direction of said planar strip so as to promote contact with an abutting electrical panel.

By planar contact array is meant any one of several planar devices such as a printed circuit board, flexible printed circuit board, ribbon cable, or flat conductor cables.

DETAILED DESCRIPTION OF THE INVENTION

Figure 1:
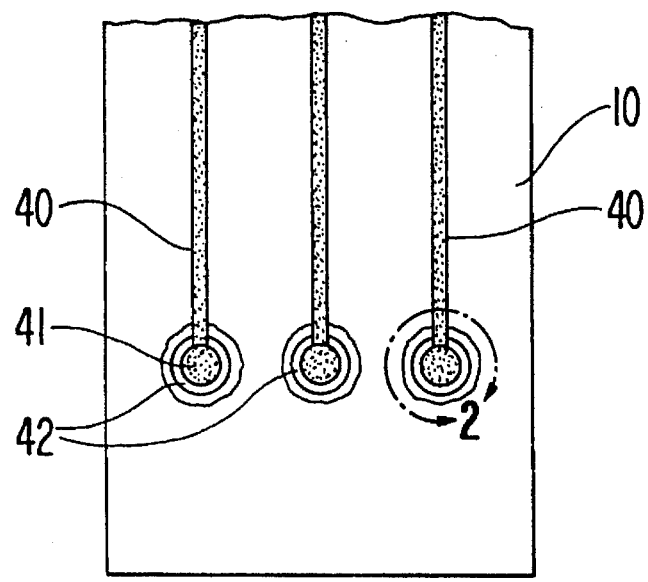
FIG. 1 is a perspective view of a planar contact array of the invention.
Figure 2:
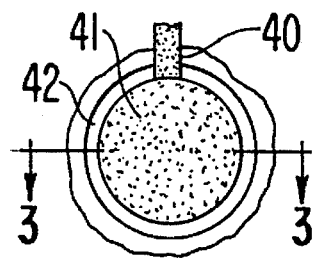
FIG. 2 is an enlargement of the circled portion 5 of FIG. 1.
Figure 3:
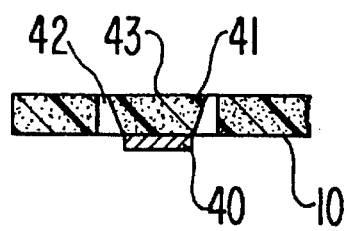
FIG. 3 is a cut through view taken along 6—6 of FIG. 2.

Referring to FIGS. 1, 2 and 3, a planar strip of insulation 10 having a plurality of parallel conductors 40 on one surface of the flexible strip is depicted. The conductors terminate near one end of strip 10 in a pad 41 configuration that is located over a hole 42 in the strip 10. The holes 42 are larger than conductive pads 41 so that the pads ride, or float, in the hole and this provides freedom for the conductive pads to move freely in the Z axis. In a preferred embodiment, shown in FIG. 3, the insulation on conductor pads 41 forms a trapezoidal cross-section at 43. It has been found that this trapezoidal configuration provides stability in the lateral direction.

Very high density conductor transmission cables can be used as the array. For example, very fine lines of conductive material of 0.001 to 0.005 inches wide and 0.0005 to 0.0015 inches thick can be used, and can be spaced parallel apart at a spacing of 0.002 inches between centers. The cable can be as thin as 0.001 inches.

One application for the cable array is in a connector assembly for connecting one printed circuit board to another printed circuit board having one end of the cable array bonded by ultrasonic welding, solder or conductive glue to make electrical contact between at least one conductive trace of the cable array and at least one conductive trace of the first printed circuit board (mother board) while the opposite end of the cable array contacts and is affixed to another printed circuit board.

I claim:

1. A planar cable array for transmitting electrical signals comprising:

an elongated planar strip of electrical insulating material 10, said strip having a plurality of holes 42 extending through the strip at a section thereof;

a plurality of parallel electrical conductors 40 affixed to and extending lengthwise along said strip;

one end of each conductor having a conductive pad attached thereto, said pad of each conductor being disposed and positioned within a corresponding aforesaid hole, whereby each said pad freely floats within said hole in the Z axis direction of said planar strip so as to promote contact with an abutting electrical panel.

2. The cable array of claim 1 wherein the insulating material over the pads is configured in a trapezoidal configuration.

* * * * *